United States Patent
Nakagawa

(10) Patent No.: US 8,679,358 B2
(45) Date of Patent: Mar. 25, 2014

(54) PLASMA ETCHING METHOD AND COMPUTER-READABLE STORAGE MEDIUM

(75) Inventor: Akira Nakagawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 153 days.

(21) Appl. No.: 13/410,432

(22) Filed: Mar. 2, 2012

(65) Prior Publication Data

US 2012/0225502 A1 Sep. 6, 2012

Related U.S. Application Data

(60) Provisional application No. 61/466,169, filed on Mar. 22, 2011.

(30) Foreign Application Priority Data

Mar. 3, 2011 (JP) .................................. 2011-046771
Mar. 2, 2012 (JP) .................................. 2012-046050

(51) Int. Cl.
*B44C 1/22* (2006.01)

(52) U.S. Cl.
USPC ................... 216/59; 216/41; 216/67; 216/72; 438/706; 438/710; 438/714

(58) Field of Classification Search
None
See application file for complete search history.

(56) References Cited

U.S. PATENT DOCUMENTS

2010/0297849 A1* 11/2010 Miyake et al. ................ 438/710

FOREIGN PATENT DOCUMENTS

JP 2006-278436 A 10/2006

* cited by examiner

*Primary Examiner* — Lan Vinh
*Assistant Examiner* — Jiong-Ping Lu
(74) *Attorney, Agent, or Firm* — Pearne & Gordon LLP

(57) ABSTRACT

A plasma etching method includes a preparation process for performing a plasma etching process using a processing gas including a first processing gas containing carbon (C) and fluorine (F), a ratio (C/F) of the first processing gas having a first value, and obtaining a residual amount of the mask layer corresponding to a variation point where a variation amount of the bowing CD is increased; a first plasma etching process using the processing gas including the first processing gas until a residual amount of the mask layer reaches the variation point; and a second plasma etching process performed after the first plasma etching process. The second plasma etching process is performed by using a processing gas including at least a second processing gas containing carbon (C) and fluorine (F), and a ratio (C/F) of the second processing gas is smaller than the first value.

10 Claims, 10 Drawing Sheets

(a)　　　　　　　　　　(b)

FIG. 6
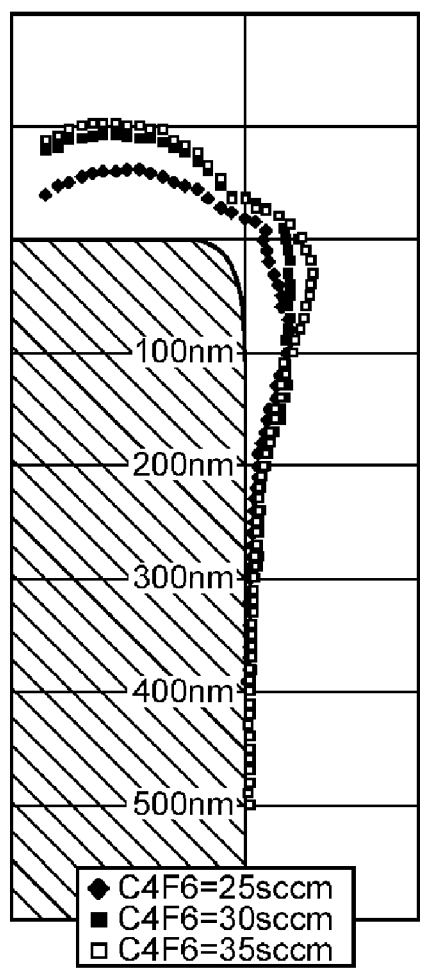
(a)
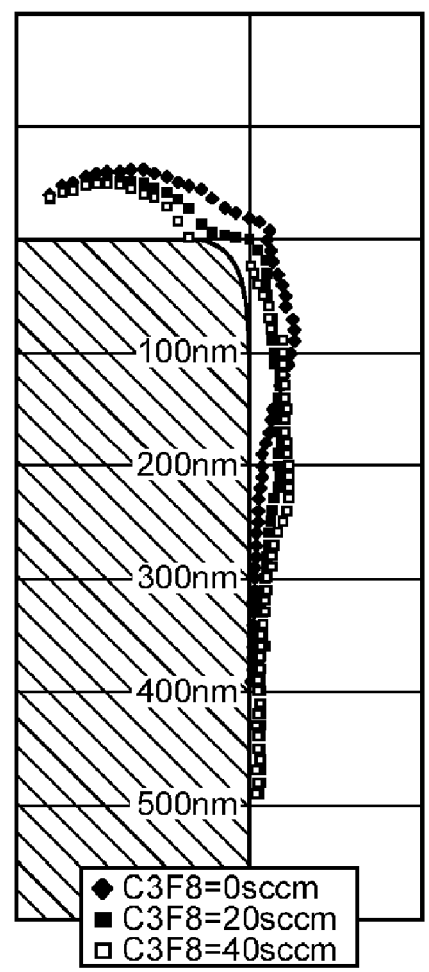
(b)

PLASMA ETCHING METHOD AND COMPUTER-READABLE STORAGE MEDIUM

CROSS-REFERENCE TO RELATED APPLICATION

This application claims the benefit of Japanese Patent Application Nos. 2011-046771 and 2012-046050 filed on Mar. 3, 2011, and Mar. 2, 2012, respectively, and U.S. Provisional Application Ser. No. 61/466,169 filed on Mar. 22, 2011, the entire disclosures of which are incorporated herein by reference.

FIELD OF THE INVENTION

The present disclosure relates to a plasma etching method and a computer-readable storage medium.

BACKGROUND OF THE INVENTION

Conventionally, in a semiconductor device manufacturing process, there has been used a plasma etching method for etching a substrate (e.g., a semiconductor wafer) in a processing chamber by using plasma. By way of example, in the semiconductor device manufacturing process, the plasma etching method has been used to form a contact hole in a silicon dioxide film. When forming a contact hole, there has been a requirement for a HARC (High Aspect Ratio Contact). However, it has been difficult to form a contact hole having a high aspect ratio while preventing a bowing from occurring and maintaining a vertical sidewall shape thereof.

As for such a plasma etching method, there is known a technique for performing a multi-step etching process by performing a process of forming a protection film by using plasma of a gas having a high deposition property and a process of etching the substrate by using plasma of a gas having a low deposition property (see, for example, Patent Document 1).

Patent Document 1: Japanese Patent Laid-open Publication No. 2006-278436

As stated above, in the semiconductor device manufacturing process, although a contact hole having a high aspect ratio is required, it has been difficult to form a contact hole having a high aspect ratio by plasma etching while preventing occurrence of a bowing and maintaining a vertical sidewall shape thereof.

BRIEF SUMMARY OF THE INVENTION

In view of the foregoing, illustrative embodiments provide a computer-readable storage medium and a plasma etching method capable of forming a contact hole having a high aspect ratio while suppressing occurrence of a bowing and maintaining a vertical sidewall shape thereof.

In accordance with one aspect of an illustrative embodiment, there is provided a plasma etching method for forming, via a mask layer, a hole in a silicon oxide film by using plasma of a processing gas including carbon (C) and fluorine (F). The plasma etching method includes a preparation process for performing a plasma etching process using a processing gas including a first processing gas containing carbon (C) and fluorine (F), a ratio (C/F) of carbon (C) to fluorine (F) of the first processing gas having a first value, investigating a relationship between residual amounts of the mask layer and bowing CDs of the hole, and obtaining a residual amount of the mask layer corresponding to a variation point where a variation amount of the bowing CD is increased; a first plasma etching process using the processing gas including the first processing gas until a residual amount of the mask layer reaches the variation point; and a second plasma etching process that is performed after the first plasma etching process. Here, the second plasma etching process is performed by using a processing gas including at least a second processing gas containing carbon (C) and fluorine (F), and a ratio (C/F) of carbon (C) to fluorine (F) of the second processing gas is smaller than the first value.

In accordance with an illustrative embodiment, it is possible to provide a computer-readable storage medium and a plasma etching method capable of forming a contact hole having a high aspect ratio while suppressing occurrence of a bowing and maintaining a vertical sidewall shape thereof.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 6 is a diagram showing a result of investigating kinds of etching gases and states of deposits;

DETAILED DESCRIPTION OF THE INVENTION

Figure 1:
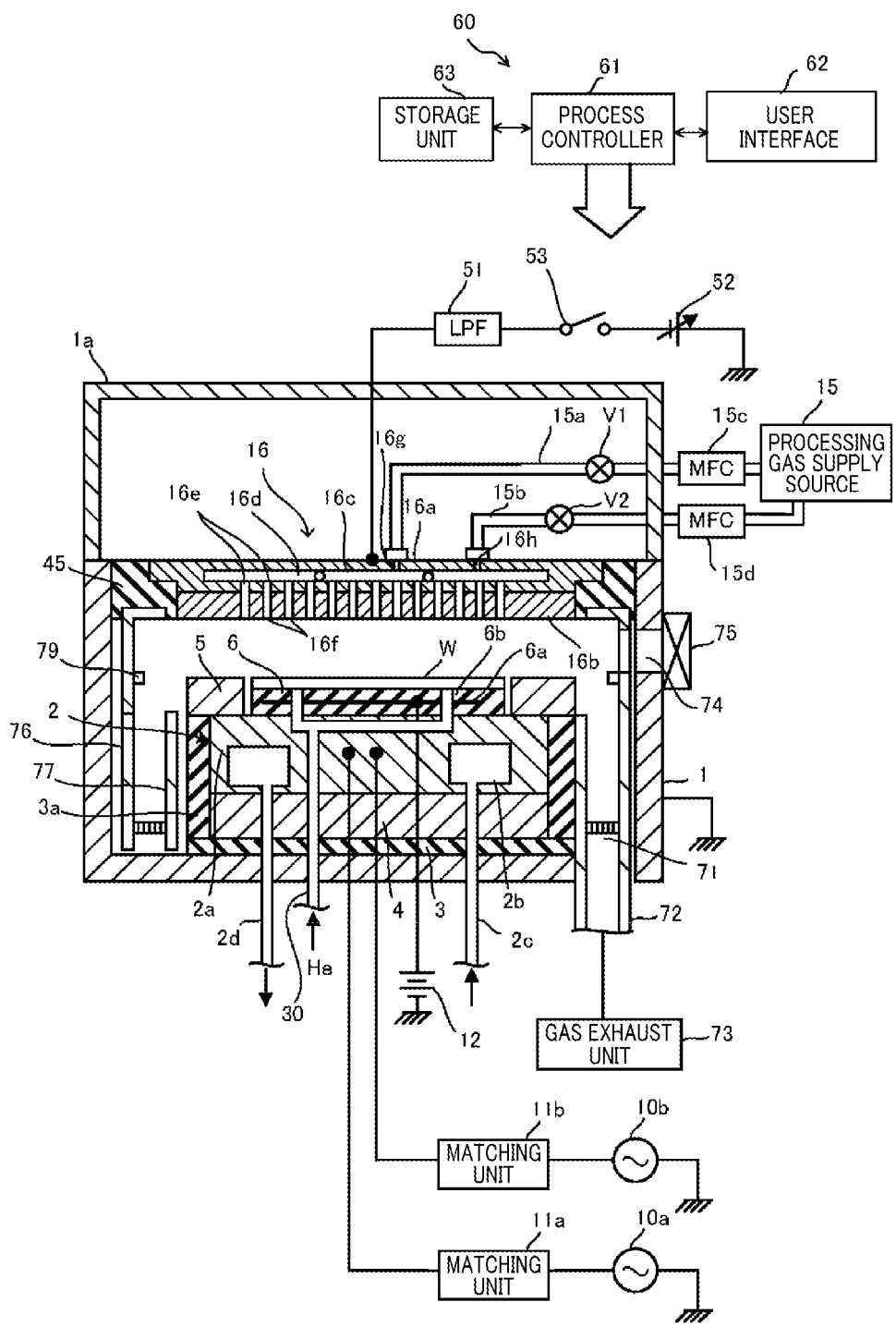
FIG. 1 is a schematic configuration view of a plasma etching apparatus to be used in an illustrative embodiment.

Hereinafter, illustrative embodiments will be described in detail with reference to the accompanying drawings. FIG. 1 illustrates a configuration of a plasma etching apparatus in accordance with an illustrative embodiment. First, the configuration of the plasma etching apparatus will be explained.

The plasma etching apparatus includes a processing chamber 1 that is airtightly sealed and electrically grounded. The processing chamber 1 has a cylindrical shape and is made of, but not limited to, aluminum having thereon an anodic oxide film. A mounting table 2 for horizontally mounting thereon a wafer W as a processing target substrate is provided in the processing chamber 1.

The mounting table 2 has a base material 2a made of a conductive metal such as aluminum, and serves as a lower electrode. The mounting table 2 is supported on a conductive support 4 on an insulating plate 3. Further, a focus ring 5 made of, e.g., single crystalline silicon is placed at an upper periphery of the mounting table 2. Furthermore, a cylindrical inner wall member 3a made of, e.g., quartz is disposed to surround the mounting table 2 and the support 4.

The base material 2a of the mounting table 2 is connected with a first high frequency power supply 10a via a first matching unit 11a and also connected with a second high frequency power supply 10b via a second matching unit 11b. The first high frequency power supply 10a is used for plasma generation, and a high frequency power of a certain frequency (equal to or higher than about 27 MHz, e.g., about 40 MHz) is supplied from the first high frequency power supply 10a to the base material 2a of the mounting table 2. Further, the second high frequency power supply 10b is used for ion attraction (bias), and a high frequency power of a certain frequency (equal to or lower than about 13.56 MHz, e.g., about 3.2 MHz) lower than the frequency of the first high frequency power supply 10a is supplied from the second high frequency power supply 10b to the base material 2a of the mounting table. Furthermore, a shower head 16 serving as an upper electrode is disposed above the mounting table 2 to face the mounting table 2 in parallel. The shower head 16 and the mounting table 2 serve as a pair of electrodes (upper electrode and lower electrode, respectively).

An electrostatic chuck 6 for electrostatically attracting and holding the semiconductor wafer W is provided on a top surface of the mounting table 2. The electrostatic chuck 6 includes an electrode 6a embedded in an insulator 6b, and the electrode 6a is connected with a DC power supply 12. The semiconductor wafer W is electrostatically attracted to and held on the electrostatic chuck 6 by a Coulomb force generated by applying a DC voltage to the electrode 6a from the DC power supply 12.

A coolant path 2b is formed within the support 4, and a coolant inlet pipe 2c and a coolant outlet pipe 2d are coupled to the coolant path 2b. By circulating a coolant such as cooling water through the coolant path 2b, the support 4 and the mounting table 2 can be controlled to have a certain temperature. Further, a backside gas supply pipe 30 for supplying a cold heat transfer gas (backside gas such as a He gas) such as a helium gas toward a rear side of the semiconductor wafer W is formed through the mounting table 2. This backside gas supply pipe 30 is connected to a non-illustrated backside gas supply source. With this configuration, the semiconductor wafer W held on the top surface of the mounting table 2 by the electrostatic chuck 6 can be controlled to have a certain temperature.

The shower head 16 is provided in a ceiling wall of the processing chamber 1. The shower head 16 includes a main body 16a and a top plate (shower plate) 16b serving as an electrode plate. The shower head 16 is supported at a top portion of the processing chamber 1 via an insulation member 45. The main body 16a is made of a conductive material such as aluminum of which surface is anodically oxidized. The top plate 16b is detachably supported on a bottom portion of the main body 16a.

Gas diffusion spaces 16c and 16d are formed within the main body 16a, and a multiple number of gas through holes 16e are formed in a bottom portion of the main body 16a to be located under the gas diffusion spaces 16c and 16d. Gas diffusion space may be divided into a multiple number of gas diffusion spaces, e.g., the two gas diffusion spaces 16c and 16d. The gas diffusion space 16c is positioned at a central portion of the main body 16a, while the gas diffusion space 16d is positioned at a periphery portion thereof. Accordingly, it is possible to independently control a supply of a processing gas at the central portion of the main body 16a and a supply of a processing gas at the periphery portion thereof.

Further, gas inlet holes 16f are formed through the top plate 16b in a thickness direction thereof to be connected with the gas through holes 16e, respectively. With this configuration, a processing gas supplied into the gas diffusion spaces 16c and 16d is dispersed and introduced into the processing chamber 1 via the gas through holes 16e and the gas inlet holes 16f, as in a shower device. A non-illustrated pipe for circulating a coolant is provided in the main body 16a and so forth, and, thus, the shower head 16 can be cooled to a desired temperature during a plasma etching process.

The main body 16a is provided with two gas inlets 16g and 16h through which the processing gas is introduced into the gas diffusion spaces 16c and 16d, respectively. The gas inlets 16g and 16h are connected to one ends of gas supply pipes 15a and 15b, respectively, and the other ends of the gas supply pipes 15a and 15b are connected to a processing gas supply source 15 that supplies a processing gas for etching. A mass flow controller (MFC) 15c and an opening/closing valve V1 are provided on the gas supply pipe 15a in sequence from the upstream side. Further, a mass flow controller (MFC) 15d and an opening/closing valve V2 are provided on the gas supply pipe 15b in sequence from the upstream side.

A processing gas for plasma etching is supplied from the processing gas supply source 15 into the gas diffusion spaces 16c and 16d via the gas supply pipes 15a and 15b. Then, the processing gas is dispersed and supplied into the processing chamber 1 via the gas through holes 16e and the gas inlet holes 16f from the gas diffusion spaces 16c and 16d, as in a shower device.

A variable DC power supply 52 is electrically connected to the shower head 16 as the upper electrode via a low pass filter (LPF) 51. A power supply of the variable DC power supply 52 is on-off controlled by an on/off switch 53. A current and a voltage of the variable DC power supply 52 and an on/off operation of the on/off switch 53 are controlled by a control unit 60 to be described later. When plasma is generated in a processing space by applying the high frequency powers from the first high frequency power supply 10a and the second high frequency power supply 10b to the mounting table 2, the on/off switch 53 is turned on by the control unit 60, if necessary, so that a certain DC voltage is applied to the shower head 16 serving as the upper electrode.

A cylindrical ground conductor 1a is extended upward from a sidewall of the processing chamber 1 to be located at a position higher than the shower head 16. The cylindrical ground conductor 1a has a ceiling wall at the top thereof.

A gas exhaust port 71 is formed in a bottom portion of the processing chamber 1, and a gas exhaust device 73 is connected to the gas exhaust port 71 via a gas exhaust pipe 72. The gas exhaust device 73 has a vacuum pump, and the inside of the processing chamber 1 can be depressurized to a certain vacuum level by operating the vacuum pump. Further, a loading/unloading port 74 for the semiconductor wafer W is formed in a sidewall of the processing chamber 1, and a gate valve 75 for opening and closing the loading/unloading port 74 is provided at the loading/unloading port 74.

Reference numerals 76 and 77 in FIG. 1 denote detachable deposition shields. The deposition shield 76 is provided along an inner wall surface of the processing chamber 1 to prevent etching byproducts (deposits) from adhering to the processing chamber 1. A conductive member (GND block) 79, which is DC-connected to the ground, is provided at the deposition shield 76 to be located at the substantially same height as the semiconductor wafer W. With this configuration, an abnormal electric discharge can be prevented.

The overall operation of the plasma etching apparatus configured as described above is controlled by the control unit 60. The control unit 60 includes a process controller 61, having a CPU, for controlling individual parts of the plasma etching apparatus; a user interface 62; and a storage unit 63.

The user interface 62 includes a keyboard through which a process manager inputs a command to manage the plasma etching apparatus; a display for visually displaying an operational status of the plasma etching apparatus; and so forth.

The storage unit 63 stores therein control programs (software) for implementing various processes performed in the plasma etching apparatus under the control of the process controller 61; and recipes including processing condition data and the like. In response to an instruction from the user interface 62 or the like, a necessary recipe is retrieved from the storage unit 63 and executed by the process controller 61, so that a desired process is performed in the plasma etching apparatus under the control of the process controller 61. The control programs and the recipes including the processing condition data can be read out from a computer-readable storage medium (e.g., a hard disk, a CD, a flexible disk, a semiconductor memory, or the like), or can be used on-line by being received from another apparatus through, e.g., a dedicated line, whenever necessary.

Now, a sequence for performing a plasma etching on, e.g., a silicon dioxide film, which is formed on a semiconductor wafer W, in the plasma etching apparatus having the above-described configuration will be explained. First, the gate valve 75 is opened, and the semiconductor wafer W is loaded by a non-illustrated transfer robot or the like into the processing chamber 1 through the loading/unloading port 74 via a non-illustrated load lock chamber, and the semiconductor wafer W is mounted on the mounting table 2. Then, the transfer robot is retreated from the processing chamber 1, and the gate valve 75 is closed. Subsequently, the processing chamber 1 is evacuated through the gas exhaust port 71 by the vacuum pump of the gas exhaust device 73.

When the inside of the processing chamber 1 reaches a certain vacuum level, a processing gas (etching gas) is supplied into the processing chamber 1 from the processing gas supply source 15, and the inside of the processing chamber 1 is maintained at a certain pressure. At this time, a supply of the processing gas from the processing gas supply source 15 can be independently controlled at a central portion of the semiconductor wafer W and a periphery portion thereof. Further, among the total supply amount of processing gas, a ratio between a supply amount to the central portion of the semiconductor wafer W and a supply amount to the periphery portion thereof can be controlled to a desired value.

In this state, a high frequency power having a frequency of, e.g., about 40 MHz is applied to the mounting table 2 from the first high frequency power supply 10a. Further, a high frequency (bias) power having a frequency of, e.g., about 3.2 MHz is applied to the mounting table 2 from the second high frequency power supply 10b to attract ions. At this time, a DC voltage is applied from the DC power supply 12 to the electrode 6a of the electrostatic chuck 6, so that the semiconductor wafer W is attracted to and held on the electrostatic chuck 6 by a Coulomb force.

As described above, by applying the high frequency powers to the mounting table 2 serving as the lower electrode, an electric field is formed between the shower head 16 serving as the upper electrode and the mounting table 2 serving as the lower electrode. Due to the electric field, an electric discharge is generated in the processing space in which the semiconductor wafer W is located. As a result, plasma of the processing gas is generated, and the silicon dioxide film formed on the semiconductor wafer W is etched by the plasma of the processing gas.

Further, as described above, by applying the DC voltage to the shower head 16 during the plasma process, the following effects can be achieved. Depending on processes to be performed, plasma having high electron density and low ion energy may be required. If the DC voltage is supplied in such a case, energy of ions implanted into the semiconductor wafer W would be decreased, and electron density of the plasma would be increased. As a consequence, an etching rate of an etching target film on the semiconductor wafer W would be increased, whereas a sputtering rate of a film serving as a mask formed on the etching target film would be reduced. As a result, etching selectivity can be improved.

Upon the completion of the above-described etching process, the supplies of the high frequency powers, the DC voltage and the processing gas are stopped, and the semiconductor wafer W is unloaded from the processing chamber 1 in a reverse sequence to the above-described sequence.

Figure 2:
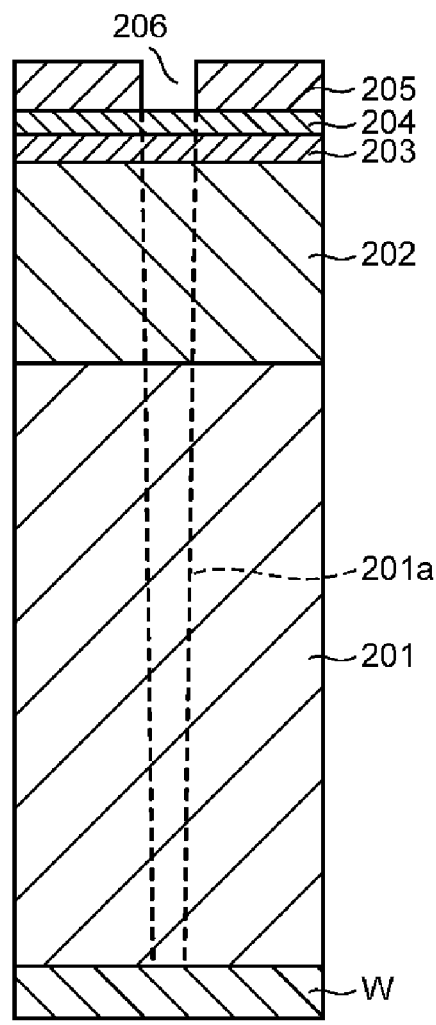
FIG. 2 is a diagram schematically illustrating a structure of a semiconductor wafer to be used in a plasma etching method in accordance with the illustrative embodiment.
Figure 3:
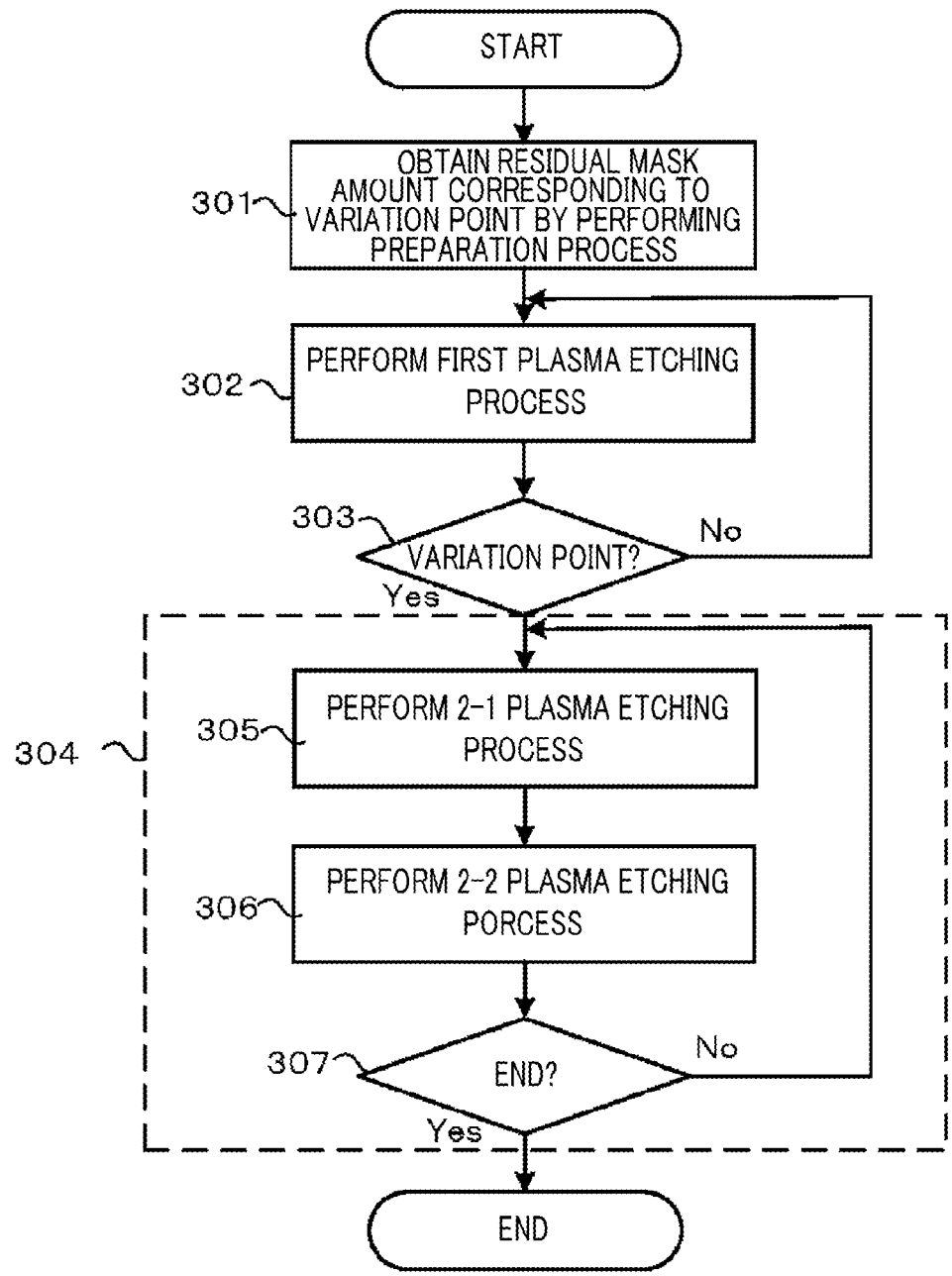
FIG. 3 is a diagram describing a process sequence of the plasma etching method in accordance with the illustrative embodiment.

Now, referring to FIGS. 2 and 3, a plasma etching method in accordance with an illustrative embodiment will be described when forming a contact hole having a high aspect ratio. FIG. 2 schematically illustrates a cross sectional structure of a semiconductor wafer W on which a plasma etching process is performed. FIG. 3 is a flowchart for describing a process sequence of the plasma etching method.

As shown in FIG. 2, a silicon dioxide ($SiO_2$) layer 201 (having a thickness of, e.g., about 2500 nm) is formed on a semiconductor wafer W as a processing target substrate. A carbon layer 202 (having a thickness of, e.g., about 900 nm) is formed on the silicon dioxide ($SiO_2$) layer 201. A SiON layer 203 and a bottom antireflection coating (BARC) layer 204 are formed on the carbon layer 202 in sequence from the bottom thereof. A photoresist layer 205 having a pattern of a certain shape and having a multiple number of hole-shaped openings 206 (only one is shown in FIG. 2) is formed on the BARC layer 204.

In accordance with the illustrative embodiment, the BARC layer 204, the SiON layer 203, and the carbon layer 202 are plasma-etched by using the photoresist layer 205 as a mask. Then, the silicon dioxide layer 201 is plasma-etched by using the carbon layer 202 as a mask substantially, so that a hole 201a having a high aspect ratio is formed in the silicon dioxide layer 201.

In the plasma etching process of the silicon dioxide layer 201, a gas containing carbon (C) and fluorine (F), such as a $C_4F_6$ gas, a $C_4F_3$ gas, or a $C_3F_8$ gas, is used as a processing gas. In the plasma etching process of the silicon dioxide layer 201, a preparation process is performed, as depicted in a flowchart of FIG. 3, and a residual amount of a mask corresponding to a variation point (folding point) to be described later is obtained (process 301 in FIG. 3). Then, a first plasma etching process (process 302 in FIG. 3) is performed, and, after the completion of the first plasma etching process, a second plasma etching process (process S304 in FIG. 3) is performed.

In the first plasma etching process, a gas including a first processing gas containing carbon (C) and fluorine (F) is used as a processing gas. Here, a ratio (C/F) of carbon (C) to fluorine (F) in the first processing gas has a first value. In the second plasma etching process, a gas including a second processing gas containing carbon (c) and fluorine (F) is used as a processing gas. Here, a ratio (C/F) of carbon (C) to fluorine (F) in the second processing gas is smaller than the first value. The first processing gas may be, but not limited to, a $C_4F_6$ gas (C/F=about 2/3) or a $C_4F_8$ gas (C/F=about 1/2). The second processing gas may be, but not limited to, a $C_3F_8$ gas (C/F=about 3/8).

Figure 4:
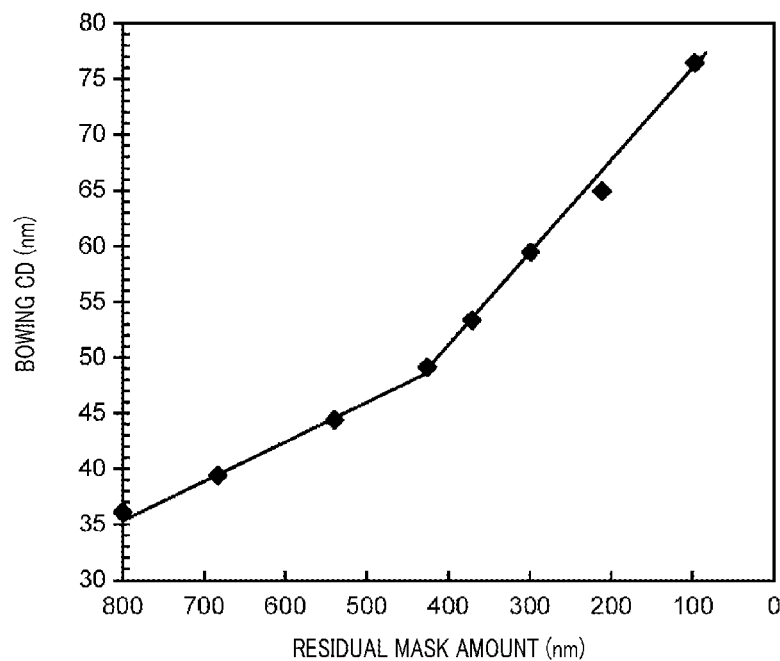
FIG. 4 is a graph showing a relationship between a bowing CD and a residual mask amount (mask height)

In the preparation process, by performing a plasma etching process using a processing gas including the aforementioned first processing gas, a relationship between a residual amount of a mask layer (residual mask amount) and a bowing CD of a hole is investigated. Then, a residual mask amount corresponding to a variation point (folding point) where a variation amount of the bowing CD is increased is obtained (process 301 in FIG. 3). By way of example, the preparation process is performed by using a gaseous mixture of a $C_4F_6$ gas, an Ar gas and an $O_2$ gas while using the $C_4F_6$ gas as the first processing gas. In a graph of FIG. 4, a vertical axis represents a bowing CD (nm), and a horizontal axis represents a residual mask amount (nm). As shown in the graph of FIG. 4, the variation amount of the bowing CD is increased if the residual mask amount becomes equal to or smaller than a certain value (around 400 nm in the example of FIG. 4). The value of the residual mask amount at the moment becomes the variation point (folding point).

Figure 5:
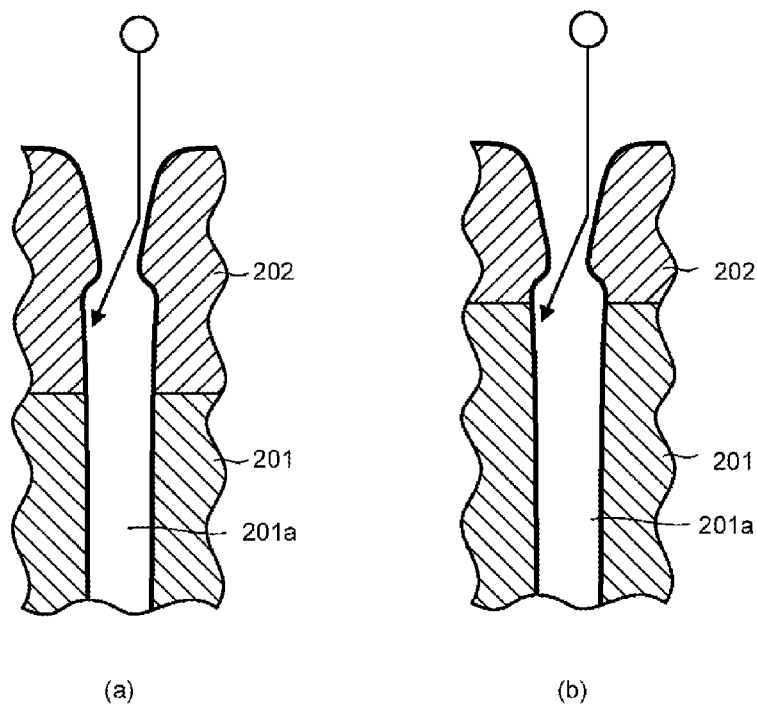
FIG. 5 is a diagram describing a relationship between a bowing CD increase and a residual mask amount.

As stated above, in the relationship between the residual mask amount and the variation amount of the bowing CD, such the residual mask amount corresponding to the variation point where the variation amount of the bowing CD is increased is deemed to be caused because of following reasons. That is, as depicted in FIG. 5(a), when the residual mask amount is great, although a heading direction of ions is changed obliquely in the vicinity of an inlet of the mask (carbon layer 202) (a protruding portion on a sidewall of the mask on which deposits are deposited protrudently), the ions collide with a sidewall of the mask (carbon layer 202). If, however, the residual mask amount is small as shown in FIG. 5(b), the heading direction of ions is changed obliquely in the vicinity of the inlet of the mask (carbon layer 202), and the ions collide with an inner sidewall of the hole 201a of the silicon dioxide layer 201 and the inner sidewall of the hole 201a is etched. As a result, a bowing within the hole 201a occurs. In this manner, the bowing amount is rapidly increased if the residual mask amount becomes equal to or smaller than a certain value.

For this reason, if the residual mask amount obtained in the preparation process reaches the value corresponding to the variation point (folding point) where the variation amount of the bowing CD is increased (process 303 in FIG. 3), the first plasma etching process (process 302 in FIG. 3) is stopped, and then, the second plasma etching process is performed (process 304 in FIG. 3). Here, the variation point (folding point) may vary depending on a top opening diameter (mask top CD) of the initial mask (photoresist layer 205). If the top opening diameter of the initial mask is larger than about 50 nm, the variation point becomes larger than about 400 nm, whereas if the top opening diameter of the initial mask is smaller than about 50 nm, the variation point becomes smaller than about 400 nm. The range of the residual mask amount corresponding to the variation point (folding point) may be varied depending on various processing conditions, a mask CD, or a mask material. Here, the residual mask amount corresponding to the variation potion (folding point) may be in the range of, e.g., about 100 nm to about 500 nm, desirably, in the range of, e.g., about 100 nm to about 400 nm, and, more desirably, in the range of, e.g., about 200 nm to about 400 nm.

In the first plasma etching process (process 302 in FIG. 3), a plasma etching is performed by using the first processing gas having a relatively higher ratio (C/F) of carbon (C) and fluorine (F) as compared to the second processing gas. For example, the plasma etching is performed by using a gaseous mixture of a $C_4F_6$ gas, an Ar gas and an $O_2$ gas. The processing gas having such a higher ratio (C/F) of carbon (C) and fluorine (F) is a so-called deposition gas having a high deposition property, and has high selectivity for silicon dioxide against carbon.

The second plasma etching process (process 304 in FIG. 3) is performed by using the second processing gas having a relatively lower ratio (C/F) of carbon (C) and fluorine (F) than that of the first processing gas. For example, the plasma etching process using the second processing gas may be performed by using a gaseous mixture of a $C_3F_8$ gas, an Ar gas and an $O_2$ gas. The second processing gas having such a lower ratio (C/F) of carbon (C) and fluorine (F) is a gas having a low deposition property, and has low selectivity for silicon dioxide against carbon.

Thus, in the second plasma etching process (process 304 in FIG. 3), a 2-1 plasma etching process (process 305 in FIG. 3) using the second processing gas and a 2-2 plasma etching process (process 306 in FIG. 3) using the first processing gas are alternately performed plural times for a short period of time (e.g., about 10 seconds) until the plasma etching process is completed (process 307 in FIG. 3). In this way, a desired degree of selectivity can be obtained while suppressing an increase of a bowing CD.

FIG. 6 schematically depicts a result of investigating a difference in deposit states when using a $C_4F_6$ gas and a $C_3F_8$ gas. As can be seen from FIG. 6(a), when the $C_4F_6$ gas is used, a large amount of deposits is deposited in the vicinity of an inlet of a hole. Further, as a flow rate of the $C_4F_6$ gas is increased, a great amount of deposits is deposited and protruded toward the inside of the hole. Meanwhile, as can be seen from FIG. 6(b), when the $C_3F_8$ gas is used, a small amount of deposits is deposited in the vicinity of the inlet of the hole, and a small amount of deposits is deposited onto the inside of the hole. That is, the etching process may be firstly performed under conditions for allowing a large amount of the deposits to be formed. Once the deposits are protruded and the residual mask amount reaches the value corresponding to the variation point (folding point), the etching process may be performed under conditions for allowing a small amount of deposits to be formed. Accordingly, the bowing can be suppressed.

As an experimental example, a preparation process is performed on a semiconductor wafer W having the structure as shown in FIG. 2 by the etching apparatus having the configuration shown in FIG. 1. Processing conditions are as follows.

Pressure: about 3.99 Pa (about 30 mTorr)

Processing gas: $C_4F_6/Ar/O_2$=about 50 sccm/about 600 sccm/about 47 sccm

High frequency power (high frequency/low frequency): about 1700 W/about 4500 W

DC voltage: about −300 V

Gas flow rate ratio at center: about 50%

Helium gas pressure (center/edge): about 2.0 kPa/about 5.32 kPa (about 15 Torr/about 40 Torr)

Temperature (top/sidewall/bottom): about 150° C./about 150° C./about 10° C.

Figure 7:
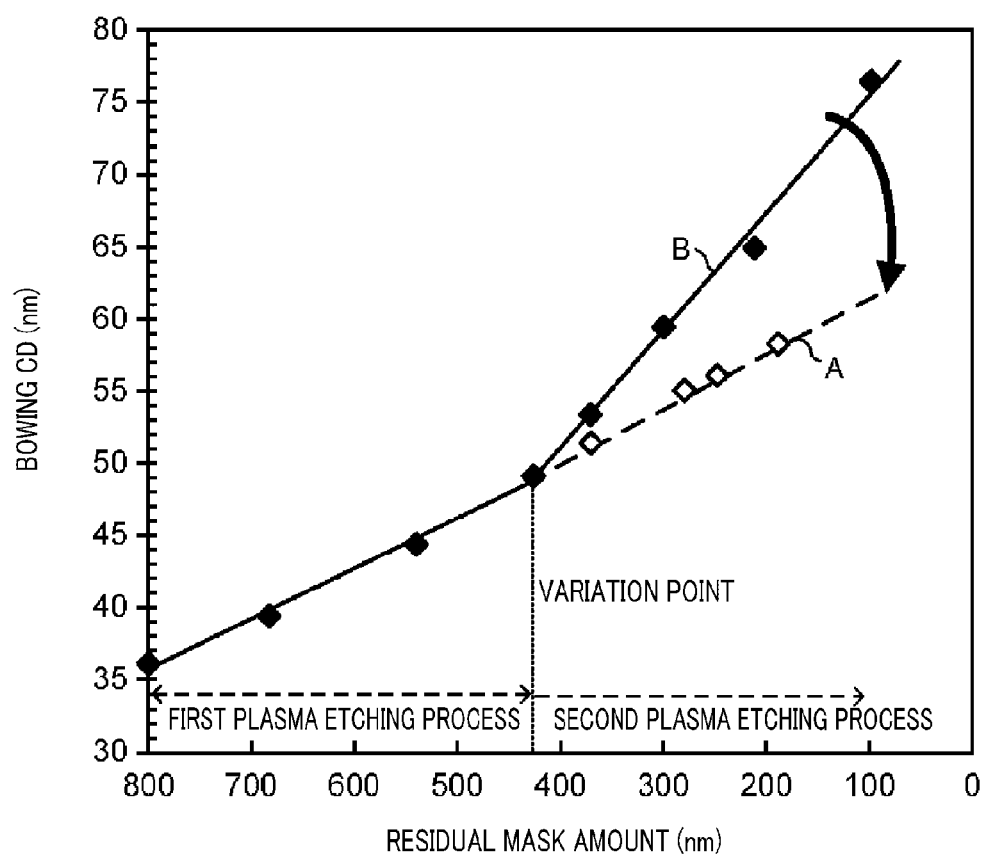
FIG. 7 is a graph showing a relationship between a bowing CD and a residual mask amount in an experimental example.

A graph of FIG. 7 shows a relationship between a bowing CD and a residual mask amount in the preparation process. In FIG. 7, a vertical axis of the graph represents a bowing CD (nm), and a horizontal axis thereof indicates a residual mask amount (nm). As can be seen by a solid line B in FIG. 7, in this preparation process, the bowing CD is increased when the residual mask amount becomes less than about 420 nm. Accordingly, the residual mask amount of about 420 nm corresponds to a variation point (folding point). Further, in this example, an initial top opening diameter the photoresist layer 205 is about 53 nm, and a final bowing CD is found to be about 68 nm. An electron micrograph of this case is shown in FIG. 8(*b*).

Based on the result of the preparation process, a first plasma etching process is performed under the same processing conditions as those of the aforementioned preparation process until the residual mask amount reaches about 420 nm. Etching time is set to be about 8 minutes. Then, a second plasma etching process is performed under the following processing conditions.

(2-1 Process)
Pressure: about 3.99 Pa (about 30 mTorr)
Processing gas: $C_3F_8/Ar/O_2$=about 60 sccm/about 600 sccm/about 10 sccm
High frequency power (high frequency/low frequency): about 1700 W/about 4500 W
DC voltage: about −300 V
Gas flow rate ratio at center: about 50%
Helium gas pressure (center/edge): about 2.0 kPa/about 5.32 kPa (about 15 Torr/about 40 Torr)
Temperature (top/sidewall/bottom): about 150° C./about 150° C./about 10° C.
Time: about 10 seconds
(2-2 Process)
Pressure: about 3.99 Pa (about 30 mTorr)
Processing gas: $C_6F_6/Ar/O_2$=about 50 sccm/about 600 sccm/about 47 sccm
High frequency power (high frequency/low frequency): about 1700 W/about 4500 W
DC voltage: about −300 V
Gas flow rate ratio at center: about 50%
Helium gas pressure (center/edge): about 2.0 kPa/about 5.32 kPa (about 15 Torr/about 40 Torr)
Temperature (top/sidewall/bottom): about 150° C./about 150° C./about lot
Time: about 10 seconds In the second plasma etching process, the 2-1 process and the 2-2 process are alternately performed plural times. As a result, as shown by a dashed line A in the graph of FIG. 7, the increase of the bowing CD after the variation point (folding point) around the residual mask amount of about 420 nm can be suppressed. Electron micrograph of this case is shown in FIG. 8(*a*). In the present experimental example, the initial top opening diameter the photoresist layer 205 is about 53 nm, and a final bowing CD is found to be about 58 nm.

Figure 8:
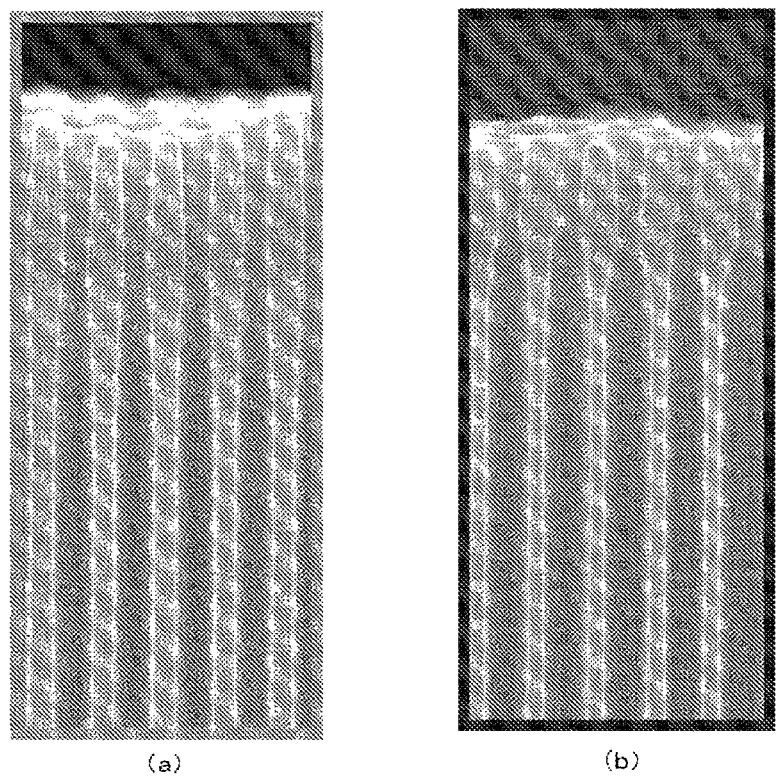
FIG. 8 is an electron micrograph showing a cross sectional state of a semiconductor wafer.
Figure 9:
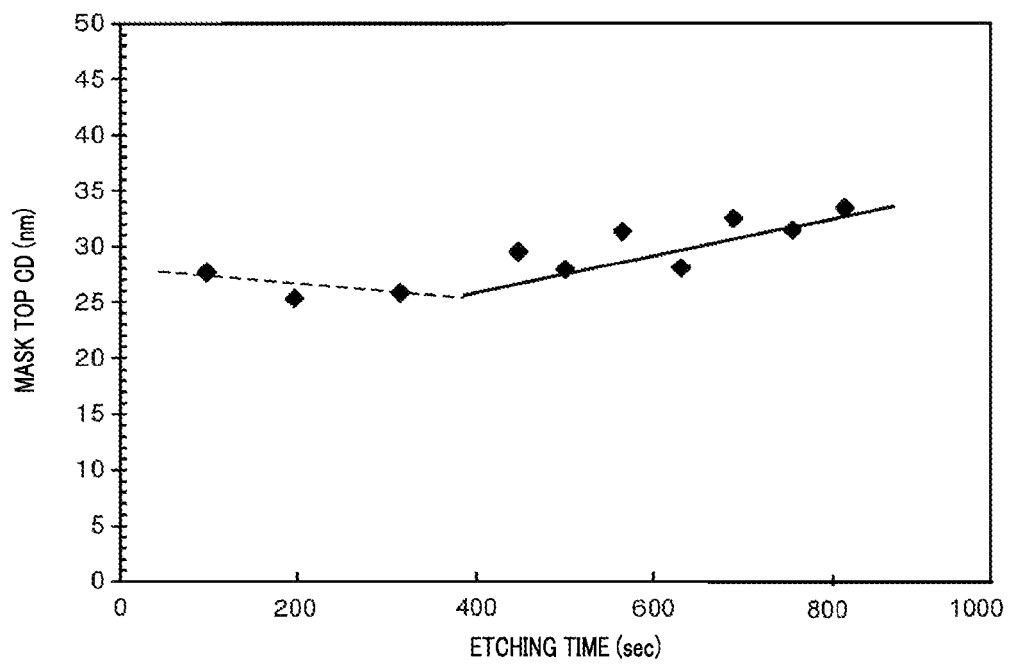
FIG. 9 is a graph showing a relationship between a mask top CD and an etching time.

Further, as can be seen from the electron micrograph of FIG. 8(*a*), in accordance with the present experimental example, the top opening diameter (mask top CD) of the carbon layer 202 as the mask layer can be maintained larger than that in a case shown in FIG. 8(*b*). FIG. 9 provides a result of investigating a relationship between an etching time and a mask top CD using another sample. As shown in FIG. 9, although the mask top CD is decreased gradually in the first plasma etching process, the mask top CD is found to be slightly increased in the second plasma etching process. Accordingly, the mask top CD at the end of the second plasma etching process is found to be larger than the mask top CD at the end of the first plasma etching process.

Figure 10:
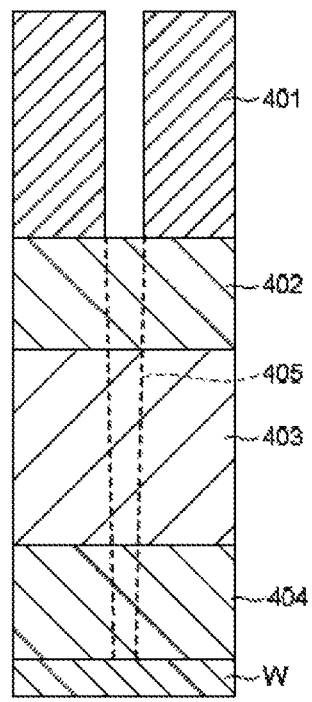
FIG. 10 is a diagram schematically illustrating a structure of a semiconductor wafer to be used in a plasma etching method in accordance with another illustrative embodiment.

The above-described embodiments and experimental example have been described when forming the hole 201*a* having the high aspect ratio by performing the plasma etching process on the silicon dioxide layer 201 while using the carbon layer 202 as a mask. However, the illustrative embodiments may not be limited to the semiconductor wafer W having the above-mentioned structure but may also be applicable to a method for forming a hole having a high aspect ratio on a semiconductor wafer W having another structure. By way of example, as illustrated in FIG. 10, the illustrative embodiments may also be applicable to a method for forming a hole 405 having a high aspect ratio on a semiconductor wafer W having a multi-layer structure. The semiconductor wafer W has thereon a polysilicon layer 401, an upper silicon dioxide layer 402, a silicon nitride layer 403, and a lower silicon dioxide layer 404 in this sequence from the top, while using the polysilicon layer 401 as a mask.

When forming the hole 405 having a high aspect ratio on the semiconductor wafer W having such a structure, a bowing may occur at a portion of the upper silicon dioxide layer 402. Further, if a heading direction of ions is downwardly inclined depending on a direction where the ions collide with a protruded portion on an inner wall of the mask, an upper portion of the lower silicon dioxide layer 404 may be etched. As a result, a bowing may occur. At this time, the bowing at the portion of the upper silicon dioxide 402 may become more conspicuous.

Figure 11:
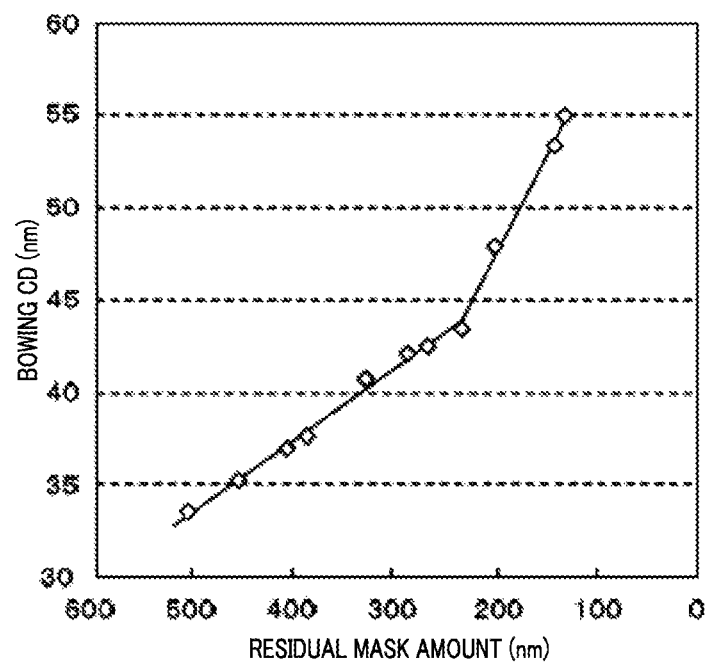
FIG. 11 is a graph showing a relationship between a bowing CD and a residual mask amount.

FIG. 11 provides a result of investigating a relationship between a bowing CD and a residual mask amount of the upper silicon dioxide layer 402. In the graph of FIG. 11, a vertical axis represents a bowing CD (nm), and a horizontal axis indicates a residual mask amount (nm). As shown in the graph of FIG. 7, if the residual mask amount falls below a certain value (e.g., about 220 nm to about 230 nm), an increment of the bowing CD increases. Accordingly, it is found that the residual mask amount of about 220 nm to about 230 nm corresponds to a variation point (folding point). By proceeding to the second plasma etching process from the first plasma etching process at the vicinity of the variation point (folding point), a bowing CD increase can be suppressed and desired selectivity can be obtained, as in the above-described illustrative embodiments and experimental example.

The variation point (folding point) may vary depending on various process conditions, or a mask CD or a mask material. Here, the residual mask amount corresponding to the variation potion (folding point) may be in the range of, e.g., about 100 nm to about 500 nm, desirably, in the range of, e.g., about 150 nm to about 300 nm, and, more desirably, in the range of, e.g., about 200 nm to about 250 nm.

Figure 12:
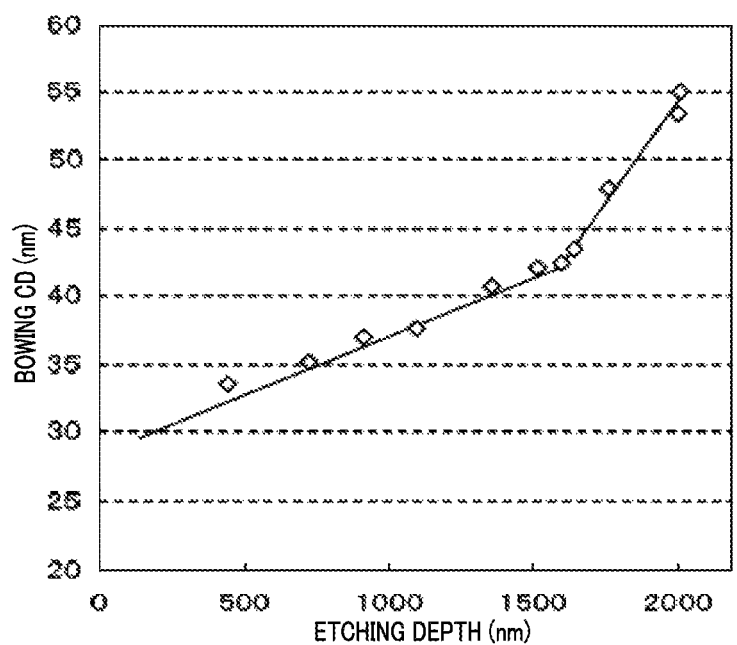
FIG. 12 is a graph showing a relationship between a bowing CD and an etching depth.

Further, a residual mask amount and an etching depth may depend on selectivity (an etching rate of an etching target layer (oxide film)/an etching rate of a mask). If the etching depth increases, the residual mask amount decreases. For this reason, as shown in a graph of FIG. 12 in which a vertical axis represents a bowing CD (nm) and a horizontal axis indicates an etching depth, the bowing CD (nm) may be analyzed in relation to the etching depth. In this case, if the etching depth reaches a certain value (e.g., about 1500 nm to about 1600 nm), there is found a variation potion (folding point) at which an increment of the bowing CD rapidly increases.

Moreover, in accordance with the above-described illustrative embodiments, as depicted in FIG. 3, in the second plasma etching process, the 2-1 plasma etching process (process 305 in FIG. 3) using the second processing gas and the 2-2 plasma etching process (process 306 in FIG. 3) using the first processing gas are alternately performed plural times for a short period of time (e.g., about 10 seconds) until the plasma etching process is completed. Although the first and second etching gases are switched alternately, it may be also possible to change gas components of an etching gas gradually.

Figure 13:
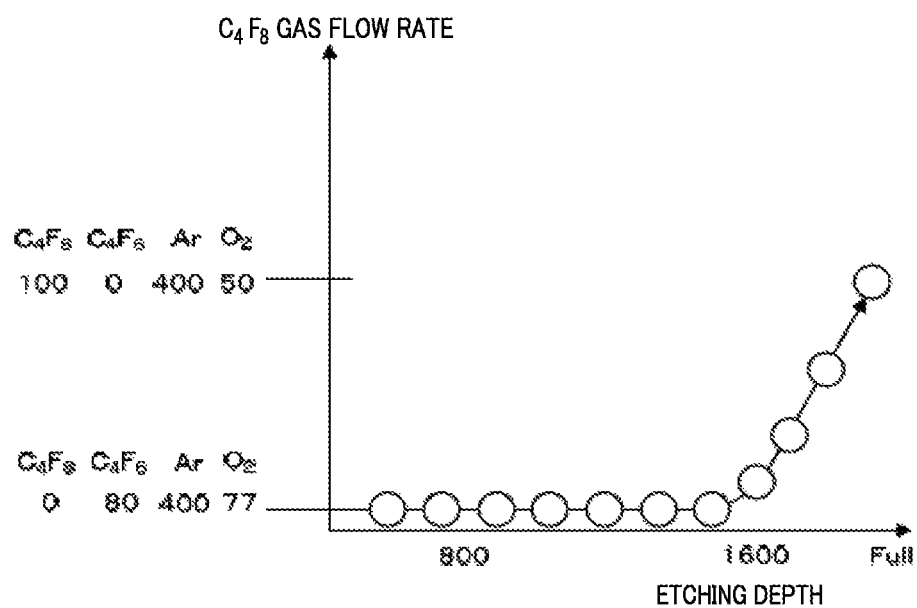
FIG. 13 is a graph showing a variation of a flow rate of an etching gas.

By way of example, as depicted in a graph of FIG. 13, in the first plasma etching process, an etching gas of $C_4F_8/C_4F_6/Ar/O_2$=about 0 sccm/about 80 sccm/about 400 sccm/about 77 sccm may be used. In the second plasma etching process, the $C_4F_8$ may be gradually increased while the $C_4F_6$ may be gradually decreased, and the $O_2$ may also be slightly decreased. In this way, the etching gas in the second etching process finally becomes, e.g., $C_4F_8/C_4F_6/Ar/O_2$=about 100 sccm/about 0 sccm /about 400 sccm/about 50 sccm. By changing the gas components of the etching gas gradually in this way, the same effects as obtained in the aforementioned illustrative embodiments and experimental example can also be achieved.

Figure 14:
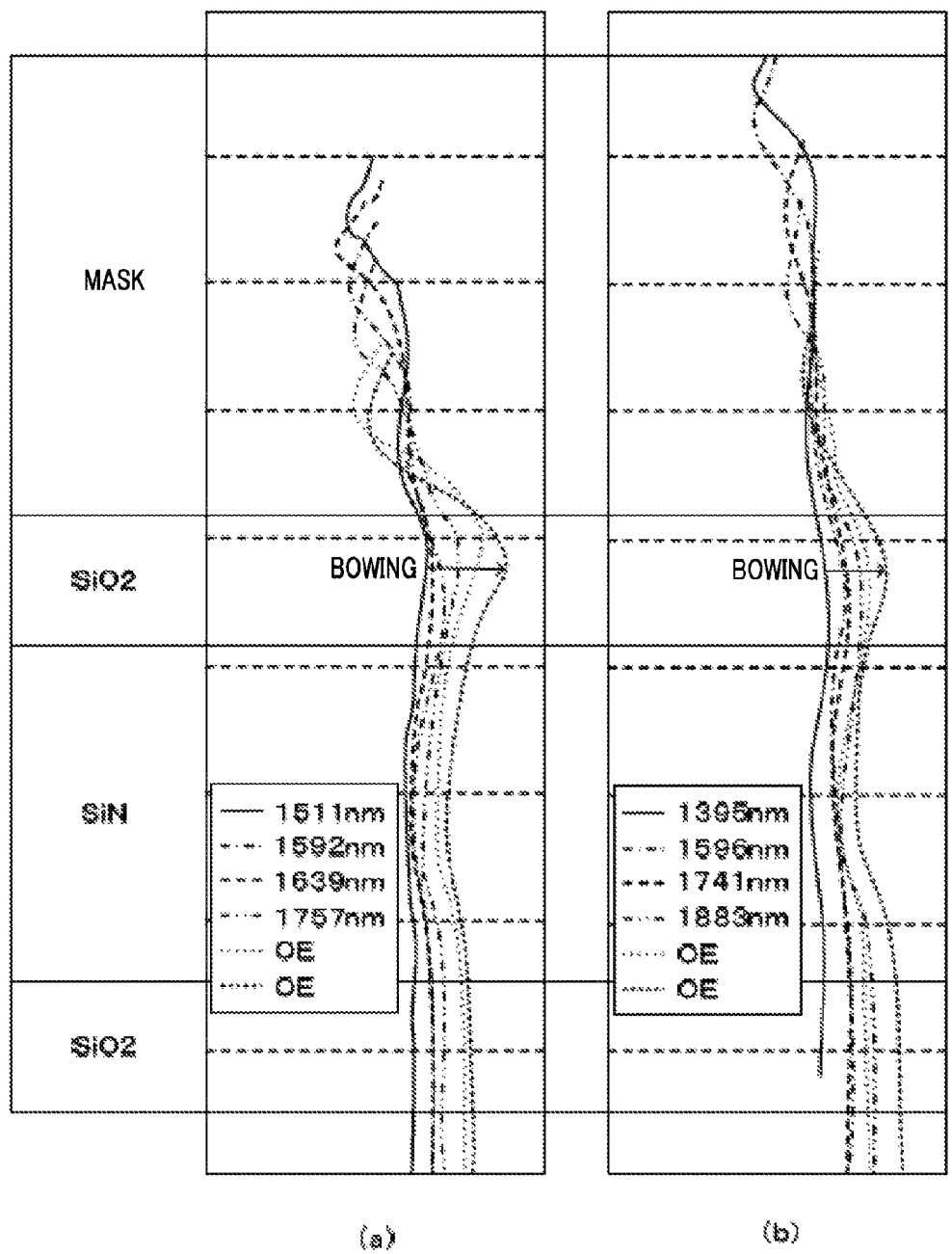
FIG. 14 is a diagram schematically illustrating a variation of a sidewall shape within a hole.

FIG. 14 provides a result of investigating a variation of a sidewall shape within the hole 405 having a high aspect ratio formed on the semiconductor wafer W having the structure shown in FIG. 10 by plasma etching. The sidewall shape of the hole 405 is observed for each etching depth by SEM, and a result of extracting contour of the sidewall shape is provided in FIG. 14. FIG. 14(a) indicates a case of performing a plasma etching process by using a single kind of etching gas throughout the whole plasma etching process under the following conditions.

Pressure: about 2.66 Pa (about 20 mTorr)
Processing gas: $C_4F_8/C_4F_6/Ar/O_2$=about 40 sccm/about 40 sccm/about 400 sccm/about 48 sccm
High frequency powers (high frequency/low frequency): about 1700 W/about 6600 W
DC voltage: about −150 V to about −900 V
Gas flow rate ratio at center: about 50%
Helium gas pressure (center/edge): about 2.0 kPa/about 5.32 kPa (about 15 Torr/about 40 Torr)
Temperature (top/sidewall/bottom): about 150° C./about 150° C./about 40° C.

FIG. 14(b) indicates a case of performing an plasma etching process while switching the first plasma etching process to the second plasma etching process at the variation point (folding point). The plasma etching process is performed under the following conditions.

(First Plasma Etching Process)
Pressure: about 2.66 Pa (about 20 mTorr)
Processing gas: $C_4F_6/Ar/O_2$=about 80 sccm/about 400 sccm/about 77 sccm
High frequency power (high frequency/low frequency): about 1700 W/about 6600 W
DC voltage: about −150 V to about −900 V
Gas flow rate ratio at center: about 50%
Helium gas pressure (center/edge): about 2.0 kPa/about 5.32 kPa (about 15 Torr/about 40 Torr)
Temperature (top/sidewall/bottom): about 150° C./about 150° C./about 40° C.

(Second Plasma Etching Process)
Pressure: about 2.66 Pa (about 20 mTorr)
Processing gas:
(Initial)
$C_4F_6/C_4F_8/Ar/O_2$=about 40 sccm/about 40 sccm/about 400 sccm/about 50 sccm
Then, $C_4F_8$ is gradually increased while $C_4F_6$ is gradually decreased, and $O_2$ is also slightly decreased.
(Final)
$C_4F_6/C_4F_8/Ar/O_2$=about 0 sccm/about 80 sccm/about 400 sccm/about 35 sccm
High frequency power (high frequency/low frequency): about 1700 W/about 6600 W
DC voltage: about −150 V to about −900 V
Gas flow rate ratio at center: about 50%
Helium gas pressure (center/edge): about 2.0 kPa/about 5.32 kPa (about 15 Torr/about 40 Torr)
Temperature (top/sidewall/bottom): about 150° C./about 150° C./about 40° C.

FIG. 14(a) shows contours of the sidewall when the etching depth is about 1511 nm, about 1592 nm, about 1639 nm, and about 1757 nm and over-etching processes (2 points) are performed. FIG. 14(b) depicts contours of the sidewall when the etching depth is about 1395 nm, about 1596 nm, about 1741 nm, and about 1883 nm and over-etching processes (2 points) are performed. As can be seen from FIG. 14, as compared to the case of FIG. 14(a) in which switchover of etching gases is not executed, the bowing of, especially, the upper silicon dioxide layer 402 is found to be suppressed in the case of FIG. 14(b) in which the etching gases are switched between the first and second plasma etching processes.

In accordance with the illustrative embodiment and experimental example as described above, it is possible to form a contact hole having a high aspect ratio while maintaining a vertical sidewall shape thereof and suppressing occurrence of a bowing. The present disclosure is not limited to the illustrative embodiment and experimental example described above, and various changes and modifications may be made.

What is claimed is:

1. A plasma etching method for forming, via a mask layer, a hole in a silicon oxide film under the mask layer using plasma of a processing gas including carbon (C) and fluorine (F), the plasma etching method comprising:
   a preparation process for performing a plasma etching process using a processing gas including a first processing gas containing carbon (C) and fluorine (F), a ratio (C/F) of carbon (C) to fluorine (F) of the first processing gas having a first value; investigating a relationship between residual amounts of the mask layer and bowing CDs of the hole which is formed at the silicon oxide film; and obtaining, in advance, a residual amount of the mask layer corresponding to a variation point where a variation amount of the bowing CD is increased;
   a first plasma etching process using the processing gas including the first processing gas until a residual amount of the mask layer reaches the variation point after the preparation process; and
   a second plasma etching process that is performed after the first plasma etching process,
   wherein the second plasma etching process is performed by using a processing gas including at least a second processing gas containing carbon (C) and fluorine (F), and a ratio (C/F) of carbon (C) to fluorine (F) of the second processing gas is smaller than the first value.

2. The plasma etching method of claim 1,
   wherein in the second plasma etching process, a plasma etching process using the second processing gas and a plasma etching process using the first processing gas are alternately performed plural times.

3. The plasma etching method of claim 1,
   wherein the first processing gas includes a $C_4F_6$ gas and the second processing gas includes a $C_3F_8$ gas.

4. The plasma etching method of claim 1,
   wherein the mask layer includes a carbon layer.

5. The plasma etching method of claim 1,
   wherein in the second plasma etching process, a flow rate of the second processing gas is gradually increased.

6. The plasma etching method of claim 5, wherein the mask layer includes a polysilicon layer.

7. The plasma etching method of claim 5, wherein the first processing gas is a $C_4F_6$ gas, and the second processing gas is a $C_4F_8$ gas.

8. The plasma etching method of claim 1, wherein in the first plasma etching process, an opening size of the mask layer becomes smaller than an initial opening size thereof, and in the second plasma etching process, an opening size of the mask layer becomes larger than the opening size of the mask layer at the end of the first plasma etching process.

9. The plasma etching method of claim 1, wherein the residual amount of the mask layer corresponding to the variation point becomes larger than about 400 nm when an initial opening size of the mask layer is larger than about 50 nm, and the residual amount of the mask layer corresponding to the variation point becomes smaller than about 400 nm when the initial opening size of the mask layer is smaller than about 50 nm.

10. The plasma etching method of claim 1, wherein a residual amount of the mask layer corresponding to the variation point is about 100 nm to about 500 nm.

* * * * *

UNITED STATES PATENT AND TRADEMARK OFFICE
CERTIFICATE OF CORRECTION

PATENT NO. : 8,679,358 B2
APPLICATION NO. : 13/410432
DATED : March 25, 2014
INVENTOR(S) : Akira Nakagawa Page 1 of 1

It is certified that error appears in the above-identified patent and that said Letters Patent is hereby corrected as shown below:

In the specification

Column 6, line 55, please replace - $C_4F_3$ - with "$C_4F_8$"

Column 9, line 33, please replace - $C_6F_6$ - with "$C_4F_6$"

Signed and Sealed this
First Day of July, 2014

Michelle K. Lee
*Deputy Director of the United States Patent and Trademark Office*